United States Patent
Naura et al.

(10) Patent No.: US 6,621,737 B2
(45) Date of Patent: Sep. 16, 2003

(54) CIRCUIT AND ASSOCIATED METHOD FOR THE ERASURE OR PROGRAMMING OF A MEMORY CELL

(75) Inventors: David Naura, Aix en Provence (FR); Bertrand Bertrand, Trets (FR); Mohamad Chehadi, Aix en Provence (FR)

(73) Assignee: STMicroelectronics SA, Montrogue (FR)

(*) Notice: Subject to any disclaimer, the term of this patent is extended or adjusted under 35 U.S.C. 154(b) by 11 days.

(21) Appl. No.: 10/096,531

(22) Filed: Mar. 11, 2002

(65) Prior Publication Data

US 2002/0126534 A1 Sep. 12, 2002

(30) Foreign Application Priority Data

Mar. 12, 2001 (FR) .............................. 01 03284

(51) Int. Cl.$^7$ .............................................. G11C 16/06
(52) U.S. Cl. ............................ 365/185.18; 365/185.19; 365/189.09
(58) Field of Search ...................... 365/185.18, 185.19, 365/189.09, 185.2, 189.11, 204, 242, 149

(56) References Cited

U.S. PATENT DOCUMENTS 5,978,268 A * 11/1999 Zink et al. .............. 365/185.18

FOREIGN PATENT DOCUMENTS

| EP | 0762428 | 3/1997 | ........... G11C/16/06 |
| EP | 0903750 | 3/1999 | ........... G11C/16/06 |
| FR | 2770326 | 4/1999 | ........... G11C/7/00 |

* cited by examiner

Primary Examiner—David Lam
(74) Attorney, Agent, or Firm—Lisa K. Jorgenson; Allen, Dyer, Doppelt, Milbrath & Gilchrist, P.A.

(57) ABSTRACT

A circuit produces a voltage for the erasure or programming of a memory cell. The circuit includes a capacitor, and a discharge circuit connected to a first terminal of the capacitor. The discharge circuit includes a first transistor, a drain of which is connected to the first terminal of the capacitor. The first transistor activates the discharge circuit when a discharge signal is received by a gate of the first transistor. The discharge circuit includes a slow discharge arm and a fast discharge arm parallel-connected to the source of the first transistor. The discharge circuit produces a low discharge current or a high discharge current for discharging the capacitor as a function of an operating mode selection signal.

27 Claims, 4 Drawing Sheets

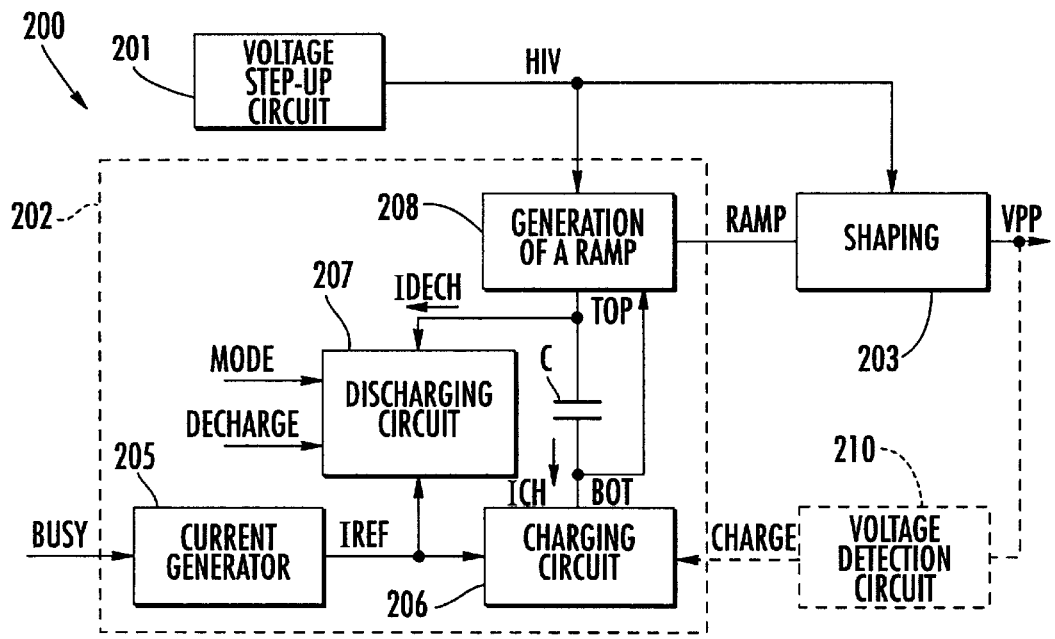
FIG. 2.
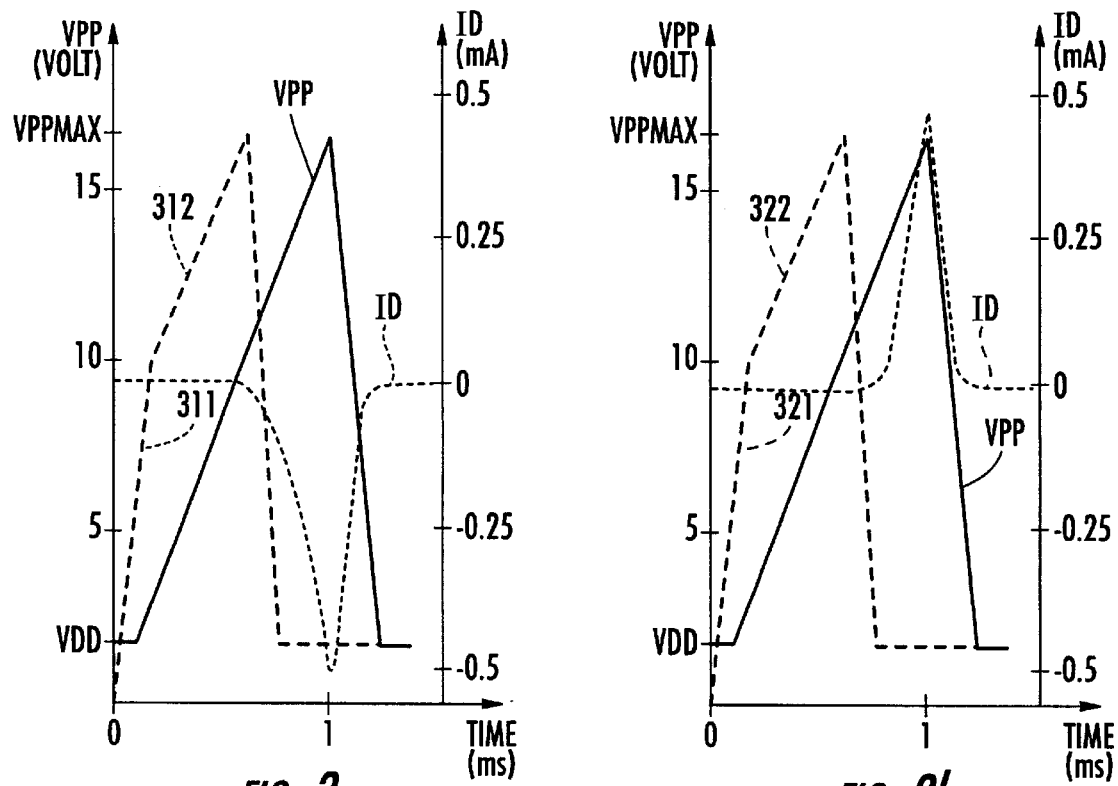
FIG. 3a.
FIG. 3b.

NOP 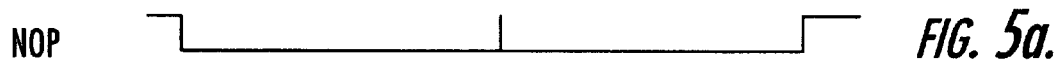
FIG. 5a.
CHARGE 
FIG. 5b.
BUSY 
FIG. 5c.
DECHARGE 
FIG. 5d.
TOP 
FIG. 5e.
BOT 
FIG. 5f.
RAMP 
FIG. 5g.
VPP 
FIG. 5h.
HIV 
FIG. 5i.
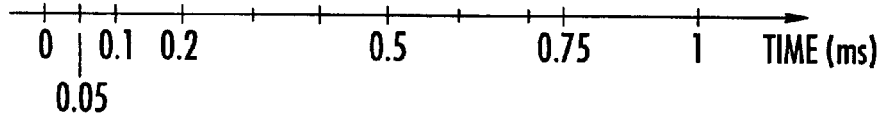

CIRCUIT AND ASSOCIATED METHOD FOR THE ERASURE OR PROGRAMMING OF A MEMORY CELL

FIELD OF THE INVENTION

The invention relates to a circuit and an associated method for the erasure or programming of a memory cell. The invention is especially useful for electrically programmable and erasable, non-volatile type memories, such as EEPROMS, flash EPROMS and other similar memories.

BACKGROUND OF THE INVENTION

A main component of a memory cell of these memories is a floating-gate storage transistor comprising a drain, a source, a control gate and a floating gate that stores information. The programming of a memory cell is usually carried out in two steps: an erasing step followed by a writing step.

To carry out a memory cell erasure step, a high voltage is applied to the control gate of the storage transistor and zero voltage is applied to the drain and source. Thus, the potential difference between the control gate and the drain of the storage transistor sets up an electrical field across the control gate and the drain. This causes electrons to migrate from the source and the drain to the floating gate, and therefore, results in the discharging of the floating gate.

Conversely, to carry out a memory cell write step, zero voltage is applied to the control gate of the storage transistor and a high voltage is applied the drain. The source is taken to a floating potential. The potential difference across the control gate and the drain of the storage transistor creates an electrical field with opposite polarity. This causes electrons to migrate in the reverse direction, from the floating gate of the storage transistor to its drain.

Thus, to carry out a memory cell write or erasure step, a high erasure or programming voltage of about 15 to 20 V needs to be available. This voltage is applied to either electrode of the storage transistor of the memory cell, depending on the operation to be performed.

However, the oxide layer between the floating gate and the drain of the storage transistor is thin and brittle. Thus, when the voltage applied to the electrodes of the storage transistor is greater than what is called the tunnel voltage, it should not vary sharply. Indeed, any sharp variation in the voltage leads to the creation of high current between the floating gate and the drain or source of the transistor. An excessive current would make the oxide layer brittle and could even damage it.

It may be recalled that the tunnel voltage is the minimum voltage needed for a charge to travel by the tunnel effect through the oxide layer, between the floating gate and the drain of a floating gate transistor. Typically, the value of the tunnel voltage is in the range of 10 V.

To obtain a voltage that varies gradually and slowly, the classic method is to use an erasure or programming circuit, a known example of which is shown in a diagrammatic view in FIG. 1a. This circuit 100 has a voltage step-up circuit 101, a voltage ramp production circuit 102 and a shaping circuit 103. All three are powered with a low power supply voltage VDD (not shown in FIG. 1a) in the range 2 to 3 V for 0.25 µm technology.

The voltage step-up circuit 101 is, for example, a charge pump type of circuit. It produces a high voltage HIV of about 15 to 20 V from the low power supply voltage VDD.

The circuit 102 produces a ramp voltage RAMP from the high voltage HIV. This ramp voltage RAMP has, for example, the shape shown by the unbroken line in FIG. 1b. The ramp voltage RAMP includes a rising phase 110 during which the voltage RAMP rises continuously up to its maximum value VMAX, which is, for example, equal to the high voltage HIV. This is followed by a voltage plateau 111 during which the voltage RAMP is constant, that is, equal to the value VMAX. There is a voltage drop 112 after the voltage plateau 111.

The ramp generation circuit 102 conventionally comprises a circuit for the charging and discharging of a power capacitor. The circuit is powered by a current source that gives a reference current IREF. The rising phase 110 of the voltage RAMP is obtained by charging a capacitor with a charging current ICH. The voltage plateau 111 for its part is obtained by the discharging of this capacitor with a discharging current IDECH.

The charging and/or discharging current used are most usually, but not necessarily, proportional to the reference current IREF and are constant. They are usually different from one another. The rising phase 110 may be lengthier or shorter than the voltage plateau 111, depending on the value of the current ICH with respect to the value of the current IDECH. The rising phase 110 and the voltage plateau 111 have a total duration TRAMP that corresponds to the duration of an erasure or programming operation.

An appropriate choice of the capacitance of the capacitor as well as the reference current IREF optimizes the slope of the rising phase 110 including the total duration TRAMP. This choice is generally a compromise based on the following criteria. When the voltage applied to the electrodes of the storage transistor is higher than the tunnel voltage, it must not vary sharply. For this purpose, the slope of the rising phase 110 must not cross a boundary value.

The total duration TRAMP must be sufficiently long for the voltage TRAMP to have the time to reach its maximum value VMAX. The voltage plateau must last long enough to ensure the full completion of an erasure or programming step, and the total duration TRAMP must be as small as possible.

The shaping circuit 103 receives the voltage RAMP and produces a high erasure or programming voltage VPP that is applied to either electrode of the memory cell (not shown in FIG. 1a), depending on whether the memory cell is to be erased or programmed. The high erasure or programming voltage VPP has, for example, the shape shown by the dashes in FIG. 1b.

This shape includes a first voltage plateau 115, during which the voltage VPP is equal to the low supply voltage VDD, and a rising phase 116 followed by a second voltage plateau 117. The voltage VPP is equal to the voltage RAMP, minus a drop in voltage VTN in a transistor. The shape also includes a drop in voltage 118, during which the voltage VPP falls back to the voltage VDD.

The voltage VPP thus follows the variations in the voltage RAMP, minus a drop in voltage VTN of about 2 V, which corresponds approximately to the conduction threshold voltage of an N-type transistor. During a programming of a memory cell, zero voltage is applied to a control gate of a floating-gate transistor, a voltage equal to VPP is applied to the drain of the transistor, and its source is left at a floating potential. The current ID flowing between the drain and the source of the transistor has, in this case, the shape shown in FIG. 1c.

The current ID is zero when the voltage VPP is rising, and is smaller than the tunnel voltage. Then it rises sharply (ref.

120) from zero up to a maximum value IDMAX when VPP crosses the tunnel voltage. The value IDMAX is reached when VPP reaches its maximum value VPPMAX. The current ID then falls again (ref. 121) throughout the duration of the plateau 117, then it drops sharply to zero (ref. 122) when the voltage VPP drops (118) to its minimum value VDD. During an erasure of the memory cell, the current flowing between the drain and the source has a similar shape. It flows simply in the reverse direction to that of its flow in the case of a programming operation.

The erasure time TER (or programming time TWR) of the memories is in the range of about 3 ms. The memory 7 erasure or programming time is thus relatively long. This may be particularly damaging in certain cases. For example, during the manufacture of the memories, all the cells of the memory are especially subjected to an endurance test. This endurance test generally includes the successive execution of several erasure and/or programming operations (about 500 such operations) to verify whether the cells have been properly manufactured, and if they meet the required specifications, especially in terms of durability.

This endurance test is only one among all the tests performed when making a memory. However, this test alone is particularly lengthy since it lasts about 2 seconds, which amounts to about half of the total duration of a full phase for testing a memory.

SUMMARY OF THE INVENTION

In view of the foregoing background, an object of the present invention to reduce the time of erasure or programming of a memory cells without harming the quality of the cell. This, in particular, would greatly reduce the duration of the endurance test for a memory when it comes off the production line.

The invention thus relates to a circuit for the production of a voltage for the erasure or programming of a memory cell. The circuit comprises a capacitor, and a discharge circuit connected to a first terminal of the capacitor to discharge the capacitor.

According to the invention, the circuit to discharge the capacitor comprises a first transistor, a drain of which is connected to the first terminal of the capacitor, and to activate the discharge circuit when a discharge signal is applied to the control gate of the first transistor. A slow discharge arm is connected to the source of the first transistor to produce a low current for discharging the capacitor when the discharge signal is received. A fast discharge arm is connected to the source of the first transistor, to produce a current for the fast discharging of the capacitor when the discharge signal and an operating mode selection signal are received simultaneously.

Thus, according to the invention, a discharge current IDECH is used. This current takes two values. This makes it possible, depending on the value used, to preserve or to reduce (or even eliminate) the plateau of the voltages RAMP, VPP, since the duration of the plateau is proportional to the value of the current IDECH. The choice of either of the values of the current IDECH is made by the user.

The circuit for the production of an erasure or programming voltage for a memory cell according to the invention works as follows. It is activated when it receives the discharge signal. Furthermore, if no mode selection signal is received, the circuit according to the invention is in a standard operating mode, and its operation in this case is similar to that of a prior art circuit.

In particular, the capacitor is discharged when the discharge signal is received in conditions similar to that of the capacitor of a prior art circuit, and the duration of the corresponding plateau is of the same magnitude. For this purpose, the discharge current chosen is a slow discharge current of the same magnitude as the discharge current used in a prior art circuit.

However, if a selection signal is received, then the circuit according to the invention is in a specific operating mode. In this case, the capacitor is discharged very rapidly, to reduce or eliminate the plateau phase and thus reduce the erasure or programming time. The fast discharging arm gives a high discharging current for this purpose. This current is, for example, 20 to 40 times the low discharge current produced by the slow discharging arm.

Reducing or eliminating the plateau of course similarly reduces the duration of any step for the erasure or programming of a memory cell. By choosing an adequate high discharge current, it is thus possible to halve the duration of such a step.

In the event of a total elimination of the plateau, the erasure of the programming of a cell is ensured only up to about 70 percent. This may be troublesome for certain applications, but not for every application. For example, in a normal mode of operation of a memory cell, it is important to ensure full programming in order to ensure, first, efficient preservation of data over time and, second, accurate read operations if necessary.

Conversely, to perform an endurance test on a memory cell, it is not indispensable to carry out a full erasure or programming of the cell. It is enough that the erasure or programming voltage applied and the current in the cell created by this voltage should reach their maximum values. The goal of this test indeed is only to watch the behavior, over time, of a cell when it undergoes high voltage and/or high current.

The circuit for the production of a voltage for the erasure or programming of a memory cell of the invention can thus be used to carry out different types of erasure or programming of memory cells, as efficiently as possible, especially in terms of time, voltages applied, currents created, etc.

The slow discharge arm comprises, for example, a second transistor, having a drain connected to the source of the first transistor and having a source connected to the ground of the circuit. The low discharge current is proportional to a reference current applied to the control gate of the second transistor. The second transistor may also be replaced by a series of parallel-connected transistors.

The fast discharge arm comprises, for example, a third transistor having one drain connected to the source of the first transistor, with the mode selection signal being applied to the control gate of the third transistor. The fast discharge arm also comprises a fourth transistor having one drain connected to a source of the third transistor, and having one source connected to the ground of the circuit. The reference current is applied to the control gate of the fourth transistor. The fourth transistor may also be replaced by a series of parallel-connected transistors.

The size of the fourth transistor (in terms of the gate width-to-length or W/L ratio) is greater than the size of the second transistor. Thus, the current across the fourth transistor, when it is on, is greater than the current across the second transistor. For example, the size of the fourth transistor is 10 to 100 times greater than the size of the second transistor.

According to another embodiment of the invention, the circuit for the production of a voltage for the erasure or programming of a memory cell also comprises a charging circuit, connected to a second terminal of the capacitor, to charge the capacitor. This charging circuit comprises a slow charging arm connected to the second terminal of the capacitor to produce a low charging current when an activation signal is received.

A fast charging arm is connected to the second terminal of the capacitor to produce a high charging current for the capacitor if the mode selection signal and a voltage level signal are received simultaneously. The voltage level signal indicates that an erasure or programming voltage given by the circuit for the production of an erasure or programming voltage is below a threshold voltage.

Thus, a charging of the capacitor is obtained, and therefore, a rise in the erasure or programming voltage varies according to the mode of operation of the circuit. When the mode selection signal is inactive, the rise in the programming or erasure voltage is slow, along only one slope. When the mode selection signal is active, the rise in the programming or erasure voltage takes place along two slopes.

One is a steep slope when the erasure or programming voltage is below a threshold value, or otherwise, it is a gentle slope. Thus, when the voltage becomes greater than the threshold voltage, its rise is similar to that of a standard operation (inactive mode selection signal). This makes it possible to avoid making excessively fast variations in the voltage applied to the oxides of the memory cell when this voltage has exceeded the tunnel voltage of the cell.

According to yet another embodiment, the circuit of the invention for the production of an erasure or programming voltage also comprises a circuit for the generation of a voltage ramp to produce a voltage ramp from potentials at the first terminal and the second terminal of the capacitor, and a shaping circuit comprising an eighth transistor. A high voltage is applied to a terminal of the eighth transistor, and the erasure or programming voltage is given at another terminal of the eighth transistor. The eighth transistor is preferably chosen to be a P-type transistor. The erasure or programming voltage may thus attain the value of the high voltage since a P-type transistor of this kind does not have any voltage drop at its terminals when it is on.

Finally, the invention also relates to a method for the production of voltage for the erasure or programming of a memory cell, during which a capacitor is charged by the application of a charging current to a second terminal during a first step. The capacitor is discharged by applying a discharge current to a first terminal of the capacitor during a second step. According to the invention, during the second step, the discharge current takes a low value, or a high value greater than the first value, as a function of a mode of operation.

BRIEF DESCRIPTION OF THE DRAWINGS

The invention will be understood more clearly and other features and advantages shall appear from the following description of an exemplary implementation of an erasure and programming circuit according to the invention. The description is made with reference to the appended drawings, of which:

FIGS. 1b and 1c are timing diagrams showing signals at certain points of the erasure or programming circuit illustrated in FIG. 1a;

FIG. 2 is a functional block diagram illustrating an erasure or programming circuit according to the present invention;

FIGS. 3a and 3b are timing diagrams of the signals at certain points of the circuit illustrated in FIG. 2;

FIGS. 5a to 5i are timing diagrams of the signals at certain points of the circuit illustrated in FIG. 2.

DETAILED DESCRIPTION OF THE PREFERRED EMBODIMENTS

Figure 1A:
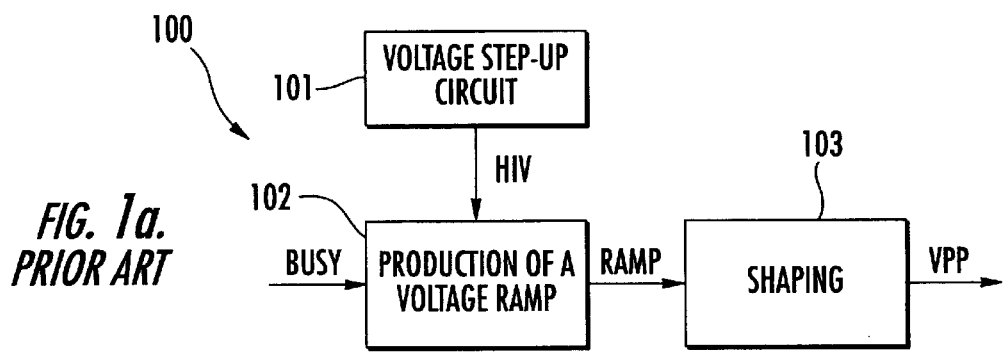
FIG. 1a is a functional block diagram illustrating a circuit for the erasure or programming of a prior art memory cell.
Figure 1B:
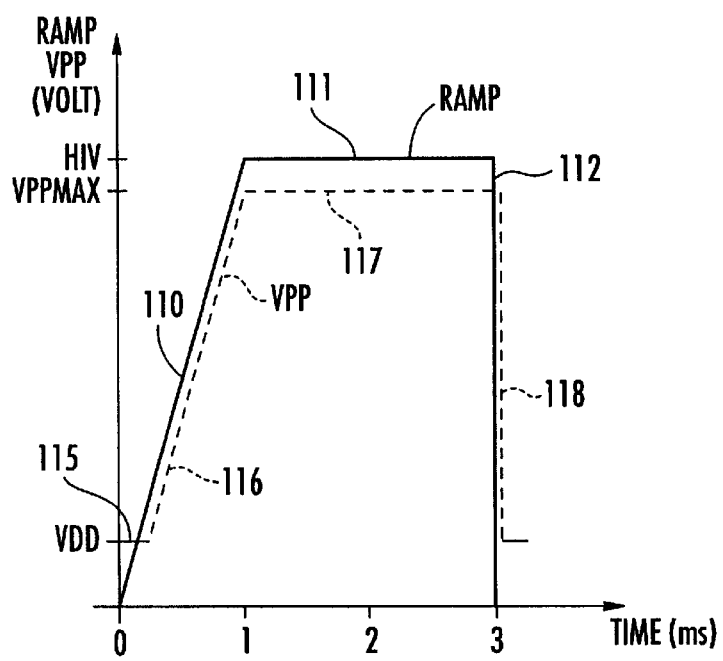
Figure 1C:
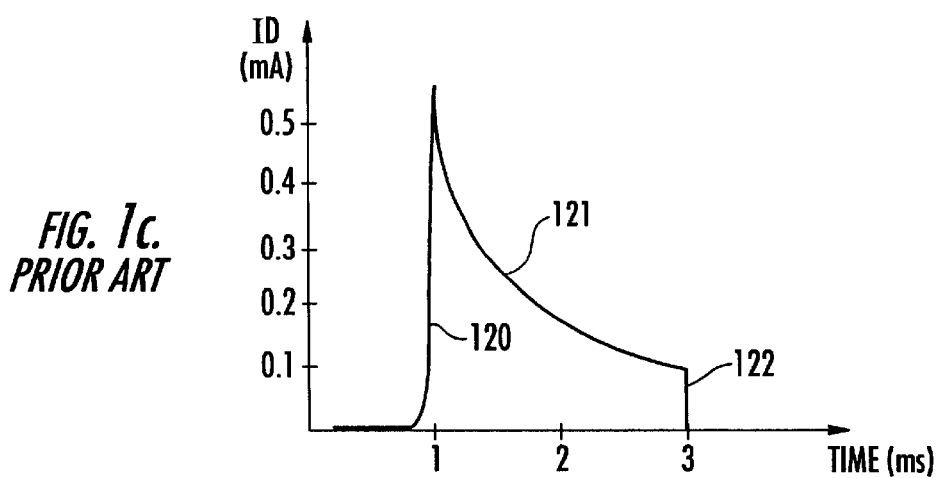

The erasure or programming voltage production circuit 200 according to the invention comprises a voltage step-up circuit 201, a voltage ramp production circuit 202 and a shaping circuit 203. The voltage step-up circuit 201 is identical, for example, to the one used in the circuit illustrated in FIG. 1a. It produces a constant and stable high voltage HIV, in the range of 20 V. The circuit 201 is activated by an activation signal BUSY (not shown) given by an external control circuit.

The circuit for the production of a voltage ramp 202 produces a ramp voltage RAMP from the high voltage HIV. The circuit 202 is activated by the activation signal BUSY, given by an external circuit. The circuit 202 comprises a capacitor C, a current generator 205, a circuit 206 for charging the capacitor C, a circuit 207 for discharging the capacitor C, and a voltage ramp generation circuit 208. At an output terminal, the current generator 205 produces a constant reference current IREF when it is activated by the signal BUSY. This current is applied to a control input terminal of the current generator 205. The capacitor C is a power capacitor, having a capacitance in the range of 5 to 10 pF, for example.

The charging circuit 206 comprises an input terminal connected to the output terminal of the current generator 205, and an output terminal connected to a terminal of the capacitor C at which a potential BOT is produced. The charging circuit 206 produces a charging current ICH from the reference current IREF. The current ICH is used to charge the capacitor C. ICH is constant and proportional to IREF.

The discharge circuit 207 comprises an input terminal connected to the output terminal of the current generator 205. There are two control input terminals to which two control signals DECHARGE, MODE are applied. An output terminal is connected to the other terminal of the capacitor C at which a potential TOP is produced. The discharge circuit 206 produces a discharge current IDECH from the reference current IREF and from the control signals DECHARGE, MODE. The current IDECH is used to discharge the capacitor C. The current IDECH is proportional to IREF and it varies as follows, as a function of the control signals DECHARGE, MODE:

IDECH=0, if DECHARGE=0
IDECH=IDECH0, if DECHARGE=1 and MODE=0
IDECH=IDECH1, if DECHARGE=1 and MODE=1

The signal DECHARGE is thus used to activate the discharge circuit 207, and the signal MODE enables the choice between two possible values IDECH0, IDECH1 for the discharge current IDECH, as a function of a chosen operating mode. IDECH1 is chosen to be greater than IDECH0, and even far greater than IDECH0. For example, IDECH0 is chosen to be in the range of IREF, and IDECH1 is chosen to be in the range of 10 to 100 times the current IREF. The currents IDECH0, IDECH1 are fixed during the making of the circuit.

The voltage ramp generation circuit 208 produces a voltage RAMP from the high voltage HIV and from the potentials BOT, TOP at the terminals of the capacitor C. The voltage RAMP varies as follows. During a first phase (growth phase), the voltage RAMP is rising, along a slope proportional to the charging current ICH of the capacitor C. During a second phase (plateau phase), the voltage RAMP is constant, and the duration of this second phase is proportional to the value of the discharging current IDECH used.

Thus, if MODE=0, then the current IDECH is equal to IDECH0 and the duration of the plateau in this case is of the same magnitude as the duration of the growth phase or the duration of the plateau phase when a prior art circuit is used. The duration of the plateau phase is thus in the range of 1 ms. On the contrary, if MODE=1, then the current IDECH is equal to IDECHI and the duration of the plateau is shorter. The plateau disappears if the value IDECHI is far greater than IDECH0.

In other words, if MODE=0, operation of the circuit according to the invention is similar to that of the prior art circuit. If MODE=1 on the contrary, the capacitor C is discharged very fast to reduce or eliminate the plateau phase and thus reduce the erasure or programming time.

The shaping circuit 203, activated by the signal BUSY (not shown in FIG. 2), produces the erasure or programming voltage VPP from the voltage RAMP. The voltage VPP varies as follows:

if BUSY is active: VPP=VDD if RAMP<VDD VPP= RAMP if RAMP>VDD if BUSY is inactive: VPP= VDD.

Operation of the circuit of FIG. 2 shall now be described with reference to the graphs of FIGS. 3a and 3b, which shows the progress of the voltage VPP applied to the electrodes of the floating gate transistor of a memory cell (not shown), and of the current ID flowing between the drain and the source of this transistor in the case of an erasure, and then a programming of the memory cell.

In the example, a current IDECH0 equal to IREF and a current IDECHI equal to 40*IREF are chosen. It is assumed, furthermore, that the signal MODE is active. A switching circuit (not shown) is connected between the circuit 200 according to the invention and the memory cell. It applies the voltage VPP to either of the electrodes of the floating-gate transistor of the memory cell depending on the operation (erasure or programming) to be performed.

During the phase of erasure of the memory cell (FIG. 3a), the voltage VPP is applied to the control gate of the floating-gate transistor, and zero voltage is applied to its drain and source. Initially, the voltage RAMP is zero, as are the potentials TOP and BOT at the terminals of the capacitor C. The voltage VPP is equal to VDD.

When the signal BUSY is activated, the voltage RAMP increases in a constant slope (for ICH is constant) and reaches a maximum. VPP starts rising when RAMP is greater than VDD and follows the variations of RAMP. The voltages RAMP, VPP then remain constant for an almost zero period of time (which is therefore not represented in FIG. 3a) corresponding to the discharge of the capacitor C with the current IDECHI. Then they drop respectively to 0 and to VDD.

The current ID flowing between the drain and the floating gate of the storage transistor is zero when VPP is smaller than the tunnel voltage VT of the transistor. Then ID drops sharply (FIG. 3a, curve in dashes) to reach a minimum value when the voltage VPP reaches its maximum. Then ID returns to 0 when VPP reaches the value VDD. The tunnel voltage in the example is equal to 10 V.

During the programming of the memory cell (FIG. 3b), the voltage VPP is applied to the drain of the floating-gate transistor, and zero voltage is applied to its control gate and its source is left at a floating potential. The progress of the voltages RAMP, VPP is similar to their progress in the case of an erasure of the cell. The current ID on the contrary develops in the opposite direction.

The circuit of FIG. 2 is improved by the addition of the voltage detection circuit 210 and by the modification of the charging circuit 206. The voltage detection circuit 210 measures the level of the erasure or programming voltage VPP, and gives a signal CHARGE having the following characteristics:

CHARGE is active if VPP<VS
CHARGE is inactive if VPP>VS, where VS is a threshold voltage. VS is chosen to be slightly below the tunnel voltage VT of the floating-gate transistor of a memory cell.

The modified charging circuit comprises an input terminal connected to the output terminal of the current generator 205 to receive the current IREF. An input terminal is connected to an output terminal of the voltage detection circuit 210 to receive the signal CHARGE, and an output terminal is connected as above to the terminal BOT of the capacitor C. The charging circuit 206 produces a charging current ICH from the reference current IREF, as a function of the signal CHARGE. The current ICH has the following properties:

ICH=ICH0 if CHARGE is active
ICH=ICH1 if CHARGE is inactive

The current ICH0 is chosen to be greater than the current ICH1. In one example, ICH0=10*ICH1. Thus, when the voltage VPP is smaller than VS, the current ICH0 is produced. This rapidly charges the capacitor C, and therefore rapidly increases the value of the voltages RAMP, VPP, along a first slope (reference 311, 321, FIGS. 3a, 3b, dashed curves). Then, when the voltage VPP reaches and goes beyond a threshold voltage VS, the current produced by the charging circuit takes the value ICH 1, so that the rise in the voltages RAMP, VPP is limited (312, 322). We thus obtain voltages RAMP, VPP rising along two slopes, a first steep slope 311, 321 and a second slow slope 312, 322. The variations of ID are of course modified accordingly.

This improvement thus preserves a limited growth for the voltages RAMP, VPP especially when the tunnel voltage is reached. This is important because the oxides of the floating gate transistor are especially brittle beyond this value. This improvement, however, even further reduces the build-up time of the voltages RAMP, VPP, and consequently the memory cell programming and/or erasure time.

Figure 4:
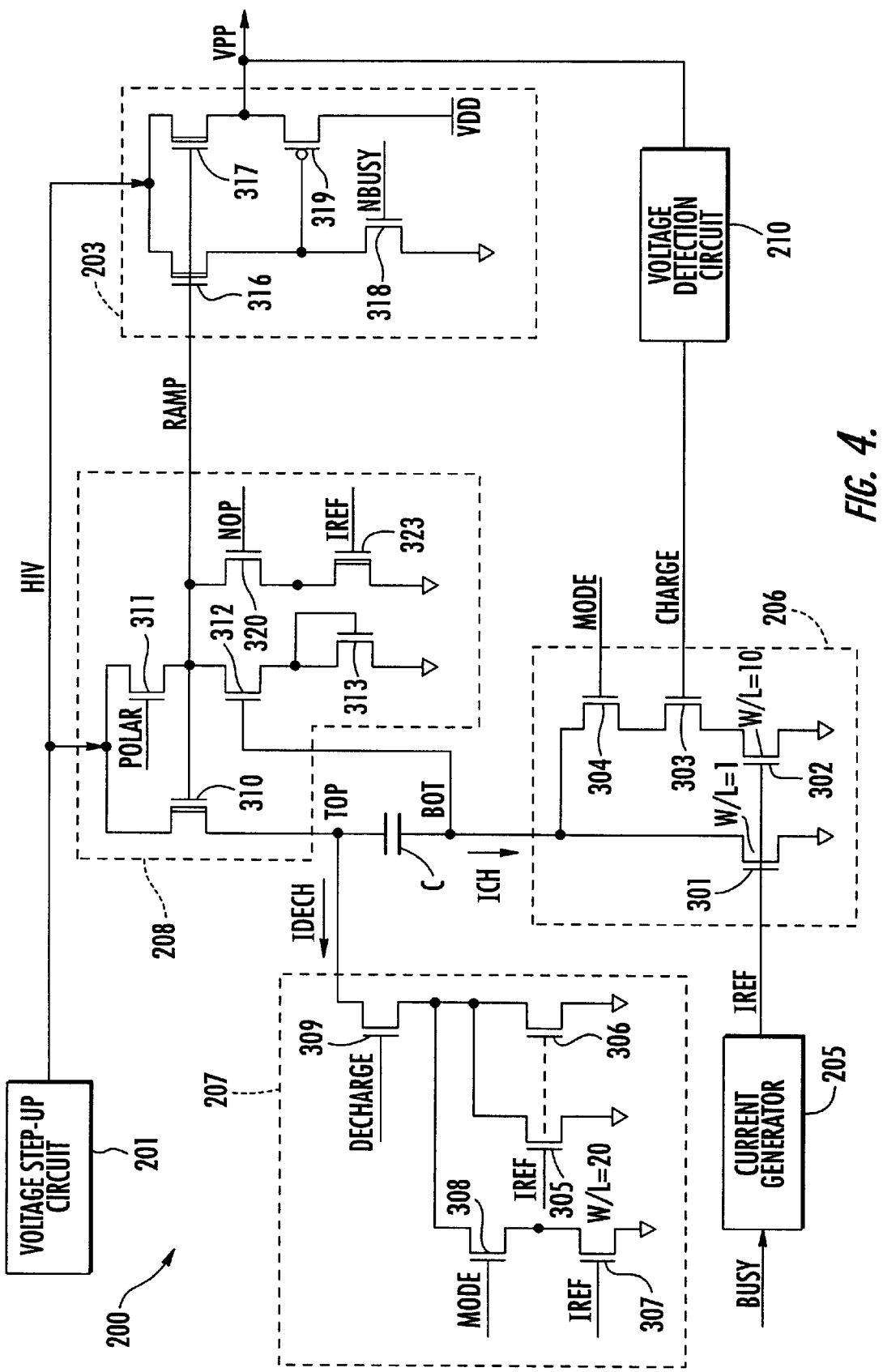
FIG. 4 is a schematic diagram illustrating certain elements of the circuit illustrated in FIG. 2.

FIG. 4 gives a detailed view of an embodiment of certain elements of the circuit 200 for the production of an erasure or programming voltage of FIG. 2. The charging circuit 206 comprises an N-type transistor 301, having a source connected to a ground of the circuit. At its gate, the transistor receives the reference current IREF and a current ICH 1 flows between its drain and source. The circuit 206 is used for the charging of the capacitor C at constant current ICH1, to give a voltage RAMP rising along only one slope.

According to the improved embodiment, the charging circuit 206 also has two N-type transistors 302, 303. The drains of the transistors 301, 303 are connected together to the terminal BOT of the capacitor C. The source of the transistor 303 is connected to the drain of the transistor 302 whose source is connected to the ground. Finally, the current IREF is applied to the gate of the transistor 302 and the control signal CHARGE is applied to the gate of the transistor 303.

The transistor 302, for example, has a size (in terms of width/length ratio or W/L) that is nine times greater than the size of the transistor 301, so that when it is on (namely, when the signal CHARGE is active), the current that flows between its drain and its source is nine times greater than the current ICHI flowing between the drain and the source of the transistor 301. This current is added to ICHI to form the current ICH0.

It may be recalled that the signal CHARGE has the following characteristics:

CHARGE is active if VPP<VS
CHARGE is inactive if VPP>VS.

Thus improved, the circuit 206 is used to charge the capacitor C when VPP<VS, with the current ICH=ICH0. ICH0 is equal to the current ICHI flowing in the transistor 301 with the addition of the current flowing in the transistors 302, 303, and when VPP>VS, with the current ICH=ICHL. In this case therefore, we have a phase of growth of the voltages RAMP, VPP in two slopes. A first steep slope when VPP<VS, followed by a second gentle slope, when VPP>VS.

The circuit 206 can be further improved by the addition of a transistor 304, having one drain connected to the drain of the transistor 301 and having one source connected to the drain of the transistor 303. The transistor 304 receives the control signal MODE at its control gate. The transistor 304 enables the user of the circuit 200 to choose a growth of the voltages RAMP, VPP along only one slope or along two slopes, by fixing the control signal MODE.

The discharge circuit 207 has three N-type transistors 307, 308, 309. The transistor 309 has a drain connected to the terminal TOP of the capacitor C and the control signal DECHARGE is applied to its gate, thus activating the discharge circuit 207.

The transistor 308 has a drain connected to the source of the transistor 309 and a source connected to a drain of the transistor 307, whose source is connected to the ground of the circuit. The control signal MODE is applied to the gate of the transistor 308 and the reference current IREF is applied to the gate of the transistor 307. The transistors 307, 308 are on only if the signal MODE is active.

The circuit 207 also has X parallel connected N-type transistors represented by the transistors 305, 306. Their drains are connected together to the source of the transistor 309 and their sources are connected together to the ground of the circuit. The current IREF is applied to the common gates of the transistors 305, 306. The X parallel connected transistors are equivalent to a single transistor with a size (W/L) equal to the sum of the sizes of all the transistors of the set 305, 306, namely a size X times greater if the transistors 305, 306 are identical.

The size, first, of the transistors 305, 306 and, second, of the transistor 307 is chosen as follows. The transistors 305, 306 are chosen so that the current IDECH0 that crosses them when they are on is weak enough to enable the formation of a plateau on the signal RAMP with a duration long enough to provide for the full and certain programming of the memory cell. The transistor 307 is chosen with a size that is far greater, so that the plateau of the voltage RAMP has a reduced duration or even a zero duration.

For example, if the transistors 305, 306 are equivalent to a transistor with a size W/L=1, it is possible to choose a transistor 307 with a size W/L=10 to 100. With this choice, the duration of the plateau of the voltages RAMP, VPP is divided by 10 to 100 when MODE is active. It thus becomes negligible as compared with the duration of the rising phase of these very same voltages.

The circuit 207 is used to discharge the capacitor C. When MODE is inactive, the discharge is done with the current ICH=IDECH0. IDECH0 is equal to the sum of the currents flowing in the transistors 305, 306. When MODE is active, the discharge is done with the current ICH=IDECH1. IDECH1 is equal to the sum of the currents flowing in all the transistors 305, 306, with the addition of the current flowing in the transistor 307. Thus, according to the choice of the user (active or inactive MODE), the plateau of the voltages RAMP, VPP either has the usual duration, equivalent to that of a known circuit, or a smaller duration or even a zero duration.

The ramp generator 208 for its part has a native transistor 310, four N-type transistors 311 to 313, 320, and one N-type native transistor 321. The ramp generator is made according to a known scheme. It gives the voltage RAMP from the voltage HIV, and from the potentials TOP, BOT to the terminals of the capacitor C.

The transistor 310 has a drain connected to an output terminal of the voltage step-up circuit 201 to receive the continuous high voltage HIV, and a source connected to the terminal TOP of the capacitor C. The drain of the transistor 311 is connected to the output terminal of the circuit 201, and its source is connected to the drain of the transistor 312 whose source is connected to the drain and the gate of the transistor 313. The source of the transistor 313 is connected to ground. The gate of the transistor 312 is connected to the terminal BOT of the capacitor C. The gate of the transistor 310 is connected to the source of the transistor 311, and a control signal POLAR is applied to the gate of the transistor 311. POLAR is equal to the inverse of BUSY.

The drain of the transistor 320 is connected to the gate of the transistor 316, and its source is connected to the drain of the transistor 321 whose source is connected to ground. A control signal NOP is applied to the control gate of the transistor 320, and the current IREF is applied to the gate of the transistor 321.

NOP is a control signal having the following characteristics. If only one operation (erasure or programming operation) is planned, then NOP is the inverse of the signal BUSY. If two (or more) successive operations are planned, for example, an erasure operation followed by a programming operation, then the signal BUSY is active from the start of the first operation up to the end of the second operation. The signal NOP is the inverse of the signal BUSY before and during the first operation, and during and after the second operation, but becomes equal to the signal BUSY at a specific point in time between the two operations. The signals NOP, BUSY are thus used to control the elements of the circuit 200 differently when several operations are performed successively as will be seen more clearly below.

The transistors 320, 321 thus have the function of bringing the voltage RAMP to 0 at the end of an erasure and/or programming step. The shaping circuit 203 has two native N-type circuit 316, 317, one N-type transistor 318, and one P-type transistor 319. The circuit 203 is made according to a known scheme. It produces the erasure or programming VPP from the voltage RAMP.

The voltage HIV is applied to the drains of the transistors 316, 317 which are connected together. The voltage RAMP is applied to the gates of the transistors 316, 317 connected together. The drain of the transistor 318 is connected to the source of the transistor 316. Its source is connected to ground, and the signal NBUSY is applied to its control gate.

The source of the transistor 319 is connected to the source of the transistor 317. Its gate is connected to the drain of the transistor 318, and the power supply voltage VDD is applied to its drain. The voltage VPP is given at the source of the transistor 317. The circuit 203 plays the role of a switching circuit which gives either the voltage RAMP if the voltage RAMP is greater than the power supply voltage VDD, or the power supply voltage VDD if the voltage RAMP is lower than the voltage VDD.

The graphs of FIGS. 5a to 5i show the progress of the control signals and of the voltages at different points of the circuit of FIG. 3 when an erasure operation followed by a programming operation is carried out. In the following case, the signal MODE is active (equal to 1), and HIV=20 V, VDD=5 V, VS=10V, ICHO=IREF to ICH1=10*IREF, IDECHI=40*IREF and IDECHO=IREF, and IREF=100 nA.

Initially, the voltages HIV, RAMP, VPP, TOP, BOT are zero voltages, the control signal NOP, CHARGE, DECHARGE are active (equal to 1) and the signal BUSY is inactive (equal to 0). The circuit 200 is activated by the signal BUSY, which goes to 1 at the instant t0=0. The signals NOP, FS, DECHARGE go to 0. The voltage HIV climbs immediately to its nominal value. The voltage VPP climbs immediately to VDD, and the voltage BOT also climbs to its maximum value, which is slightly below HIVmax.

Since CHARGE is active, the charging current ICH is equal to ICH1. The fast charging of the capacitor C starts up, and the voltage TOP starts climbing linearly along a steep slope, and the voltage RAMP also climbs along the same slope by capacitive coupling between the gate and the source of the transistor 310. Since RAMP<VDD, the voltage VPP is equal to VDD, imposed by the transistors 317, 319. When RAMP reaches the value VDD (at the end of approximately 0.02 ms), the voltage VPP becomes equal to the voltage RAMP, and the voltages VPP, RAMP, TOP continue to climb along the same slope.

When VPP reaches VS=10 V, the detector 210 deactivates the signal CHARGE. The transistor 303 goes off and the charging current diminishes greatly, it takes the value ICHO. The voltages TOP, RAMP, VPP continue to rise, but in a far more gentle slope. The potential BOT remains equal to its maximum value.

A time comes when the potential TOP reaches a maximum value, equal to about the voltage HIV minus the drop in voltage in the transistor 310. The capacitor continues to be charged and the potential BOT diminishes. When the potential BOT becomes lower than the threshold potential of the transistor 312, the potential BOT cancels the charging current ICH and makes the signal DECHARGE active. The discharge signal is activated and the current IDECH= IDECHI is produced, which rapidly discharges the capacitor C.

The potential BOT reaches a zero value, and the potential TOP diminishes rapidly. On the contrary, the voltage RAMP remains constant, and equal to its maximum value because the transistor 312 is off. When the potential TOP becomes lower than a threshold potential, it makes the signal DECHARGE inactive, and the discharging of the capacitor C is stopped if it has not already been terminated. At this precise point in time, the signals NOP, FS briefly go to 1. Consequently, the voltage RAMP drops to 0 (with the transistor 320 on) and voltage VPP drops to VDD since RAMP is lower than VDD (the role of the transistors 317, 319). The erasure operation ends and the programming operation then begins. The signals develop similarly for this operation.

That which is claimed is:

1. A circuit for producing a voltage for erasing or programming a memory cell, the circuit comprising:
   a capacitor; and
   a discharge circuit connected to a first terminal of said capacitor, and comprising
   a first transistor comprising a gate for receiving a discharge signal, a source, and a drain connected to the first terminal of said capacitor,
   a slow discharge arm connected to the source of said first transistor to produce a low discharge current for discharging said capacitor when the discharge signal is received by the gate of said first transistor, and
   a fast discharge arm connected to the source of said first transistor to produce a high discharge current for a fast discharge of said capacitor when the discharge signal and an operating mode selection signal are received.

2. A circuit according to claim 1, wherein said slow discharge arm comprises at least one second transistor comprising a gate for receiving a reference current, a drain connected to the source of said first transistor, and a source connected to a voltage reference; and wherein the low discharge current is proportional to the reference current.

3. A circuit according to claim 2, wherein said at least one second transistor comprises at least one pair of parallel-connected second transistors, with the respective gate, source and drain of each second transistor being connected in common with each other; and wherein the high discharge current is greater than the low discharge current, and the high discharge current is proportional to the reference current applied to the common gates.

4. A circuit according to claim 1, wherein said fast discharge arm comprises:
   a third transistor comprising a gate for receiving the operating mode selection signal, a source, and a drain connected to the source of said first transistor; and
   at least one fourth transistor comprising a gate for receiving the reference current, a source connected to a voltage reference, and a drain connected to the source of said third transistor.

5. A circuit according to claim 4, wherein said at least one fourth transistor comprises at least one pair of parallel-connected fourth transistors, with the respective gate, source and drain of each fourth transistor being connected in common with each other.

6. A circuit according to claim 4, wherein said slow discharge arm comprises at least one second transistor; and wherein a size of said at least one fourth transistor is greater than a size of said at least one second transistor.

7. A circuit according to claim 6, wherein the size of said at least one fourth transistor is within a range of about 10 to 100 times greater than the size of said at least one second transistor.

8. A circuit according to claim 1, further comprising a charge circuit connected to a second terminal of said capacitor, and comprising:
   a slow charging arm connected to the second terminal of said capacitor to produce a low charging current when an activation signal is received; and
   a fast charging arm connected to the second terminal of said capacitor to produce a high charging current if the operating mode selection signal and a voltage level signal are received simultaneously, with the voltage level signal indicating that the erasing or programming voltage is below a threshold.

9. A circuit according to claim 8, wherein said fast charging arm comprises:
   a fifth transistor comprising a gate, a source connected to a voltage reference, and a drain;
   a sixth transistor comprising a gate for receiving the voltage level signal, a source connected to the drain of said fifth transistor, and a drain; and a seventh transistor comprising a gate for receiving the operating mode selection signal, a source connected to the drain of said sixth transistor, and a drain connected to the second terminal of said capacitor.

10. A circuit according to claim 1, further comprising:
a ramp circuit connected to the first and second terminals of said capacitor for generating a voltage ramp based upon voltages at the first and second terminals; and
a shaping circuit connected to said ramp circuit, and comprising an eighth transistor comprising a gate for receiving the voltage ramp, a source for receiving a high voltage, and a drain for providing the voltage for erasing or programming the memory cell.

11. A circuit according to claim 10, wherein said eighth transistor comprises a P-type MOS transistor.

12. A circuit for erasing or programming a memory cell, the circuit comprising:
a capacitor;
a charge circuit connected to a first terminal of said capacitor;
a discharge circuit connected to a second terminal of said capacitor and operating in response to a discharge signal and an operating mode selection signal, the discharge circuit comprising
a slow discharge arm for producing a low discharge current for discharging said capacitor when the discharge signal is received, and
a fast discharge arm connected to said slow discharge arm for producing a high discharge current for a fast discharge of said capacitor when the discharge signal and the operating mode selection signal are received;
a ramp circuit for generating a ramp voltage based upon voltages at the first and second terminals of said capacitor; and
a shaping circuit connected to said ramp circuit for providing the voltage for erasing or programming the memory cell based upon the ramp voltage.

13. A circuit according to claim 12, wherein said discharge circuit further comprises a first transistor comprising a control transistor for receiving the discharge signal, a first conduction terminal, and a second conduction terminal connected to the second terminal of said capacitor; and wherein said slow and fast discharge arms are connected to the first conduction terminal of said first transistor.

14. A circuit according to claim 13, wherein said slow discharge arm comprises at least one second transistor comprising a control terminal for receiving a reference current, a first conduction terminal connected to a voltage reference, and a second conduction terminal connected to the first conduction terminal of said first transistor; and wherein the low discharge current is proportional to the reference current.

15. A circuit according to claim 14, wherein said at least one second transistor comprises at least one pair of parallel-connected second transistors, with the respective control terminal, and first and second conduction terminals of each second transistor being connected in common with each other; and wherein the high discharge current is greater than the low discharge current, and the high discharge current is proportional to the reference current applied to the common control terminals.

16. A circuit according to claim 13, wherein said fast discharge arm comprises:
a third transistor comprising a control terminal for receiving the operating mode selection signal, a first conduction terminal connected to the first conduction terminal of said first transistor, and a second conduction terminal; and at least one fourth transistor comprising a control terminal for receiving the reference current, a first conduction terminal connected to a voltage reference, and a second conduction terminal connected to the first conduction terminal of said third transistor.

17. A circuit according to claim 16, wherein said at least one fourth transistor comprises at least one pair of parallel-connected fourth transistors, with the respective control terminal, and first and second conduction terminals of each fourth transistor being connected in common with each other.

18. A circuit according to claim 16, wherein said slow discharge arm comprises at least one second transistor; and wherein a size of said at least one fourth transistor is within a range of about 10 to 100 times greater than a size of said at least one second transistor.

19. A circuit according to claim 12, wherein said charge circuit comprises:
a slow charging arm connected to the first terminal of said capacitor to produce a low charging current when an activation signal is received; and
a fast charging arm connected to the first terminal of said capacitor to produce a high charging current if the operating mode selection signal and a voltage level signal are received simultaneously, with the voltage level signal indicating that the erasing or programming voltage is below a threshold.

20. A circuit according to claim 19, wherein said fast charging arm comprises:
a fifth transistor comprising a control terminal, a first conduction terminal connected to a voltage reference, and a second conduction terminal;
a sixth transistor comprising a control terminal for receiving the voltage level signal, a first conduction terminal connected to the second conduction terminal of said fifth transistor, and a second conduction terminal; and
a seventh transistor comprising a control terminal for receiving the operating mode selection signal, a first conduction terminal connected to the second conduction terminal of said sixth transistor, and a second conduction terminal connected to the first terminal of said capacitor.

21. A method for producing a voltage for erasing or programming a memory cell, the method comprising:
charging a capacitor using a charge circuit connected to a first terminal of the capacitor;
discharging the capacitor using a discharge circuit connected to a second terminal of the capacitor, the discharging being responsive to a discharge signal and an operating mode selection signal, and comprising
producing a low discharge current at the first terminal of the capacitor when the discharge signal is received, and
producing a high discharge current at the first terminal of the capacitor when the discharge signal and the operating mode selection signal are received simultaneously;
generating a ramp voltage based upon voltages at the first and second terminals of the capacitor; and
providing the voltage for erasing or programming the memory cell based upon the ramp voltage.

22. A method according to claim 21, wherein the discharge circuit comprises a first transistor comprising a control transistor for receiving the discharge signal, a first conduction terminal, and a second conduction terminal connected to the second terminal of said capacitor; wherein the slow discharge current is produced by a slow discharge arm connected to the first conduction terminal of the first transistor; and wherein the high discharge current is produced by a fast discharge arm connected to the first conduction terminal of the first transistor.

23. A method according to claim 22, wherein the slow discharge arm comprises at least one second transistor comprising a control terminal for receiving a reference current, a first conduction terminal connected to a voltage reference, and a second conduction terminal connected to the first conduction terminal of the first transistor; and wherein the low discharge current is proportional to the reference current.

24. A method according to claim 23, wherein the at least one second transistor comprises at least one pair of parallel-connected second transistors, with the respective control terminal, and the first and second conduction terminals of each second transistor being connected in common with each other; and wherein the high discharge current is greater than the low discharge current, and the high discharge current is proportional to the reference current applied to the common control terminals.

25. A method according to claim 22, wherein the fast discharge arm comprises:

a third transistor comprising a control terminal for receiving the operating mode selection signal, a first conduction terminal connected to the first conduction terminal source of the first transistor, and a second conduction terminal; and at least one fourth transistor comprising a control terminal for receiving the reference current, a first conduction terminal connected to a voltage reference, and a second conduction terminal connected to the first conduction terminal of the third transistor.

26. A method according to claim 25, wherein the slow discharge arm comprises at least one second transistor; and wherein a size of the at least one fourth transistor is within a range of about 10 to 100 times greater than a size of the at least one second transistor.

27. A method according to claim 21, wherein the charging circuit comprises a slow charging arm and a fast charging arm connected to the first terminal of the capacitor; and wherein the charging comprises:

producing a low charging current using the slow charging arm when an activation signal is received; and producing a high charging current using the fast charging arm if the operating mode selection signal and a voltage level signal are received simultaneously, with the voltage level signal indicating that the erasing or programming voltage is below a threshold.

* * * * *